July 2, 1968 A. G. VALLES 3,390,992

NON-ETCHING CIRCUIT FABRICATION

Filed June 15, 1964

INVENTOR.
ANTHONY G. VALLES

BY [signature]

ATTORNEY

United States Patent Office 3,390,992

Patented July 2, 1968

3,390,992

NON-ETCHING CIRCUIT FABRICATION

Anthony G. Valles, Pomona, Calif., assignor to North American Rockwell Corporation, a corporation of Delaware Filed June 15, 1964, Ser. No. 375,271
8 Claims. (Cl. 96—36.2)

ABSTRACT OF THE DISCLOSURE

A method for producing without etching a conductive electrical circuit pattern on an epoxy-glass substrate. An epoxy impregnated glass substrate is coated first with a hydrophilic dispersion of colloidal aluminum and then with a layer of a photosensitive and hydrophilic compound comprising P-diazo diphenyl amine sulphate and zinc chloride. The compound is exposed to ultraviolet light through a mask to produce a latent image of the desired circuit pattern, which image is developed with a developer comprising a thermo-setting resin. Unexposed regions of the photosensitive compound are dissolved by the developer. The entire surface next is coated with comminuted metal particles and heated to fuse the metal particles to the thermo-setting resin. Finally, metal is plated over the fused comminuted particles.

This invention relates to a method for producing a conductive circuit pattern on an insulative substrate and more particularly to a method for forming a circuit pattern on an insulative substrate by use of photosensitive materials and thermo-setting materials.

Circuit patterns are generally produced on an insulative substrate by etching techniques which have various limiting aspects. For example, the copper forming the desired circuit pattern is often undercut during etching. It is also difficult to utilize etching processes where thin line conductor patterns are required, as in the field of microminiaturization.

An object of this invention is to provide a process for applying a conductive circuit pattern onto a non-conductive substrate such as anodized aluminum, epoxy, epoxy-glass, glass, etc. in a manner which overcomes many of the limitations of the etching processes.

Another object of this invention is to provide a method for producing a circuit pattern on an insulative substrate whereby etching is eliminated.

Another object of this invention is to provide a method for direct application of conductive circuits onto an insulative substrate.

Another object is to provide a method for producing a reliable and accurate microminiaturized circuit pattern on a microminiaturized insulative substrate.

Another object is to provide a relatively more economical method for producing a microminiaturized circuit pattern on a microminiaturized insulative substrate.

Still another object is to produce a conducting circuit pattern on an insulative substrate without undercutting the conducting portions of the circuit pattern.

According to the present invention, a desired circuit pattern is formed on an insulative substrate by the use of a hydrophilic photosensitive material deposited on the substrate as a film of desired thickness and exposed to ultra-violet light in a pattern of the desired conductive circuit. After exposure, the photosensitive material is developed by applying, for example by rubbing, a thermo-setting material on top of the photosensitive material to form a tacky and hydrophobic film defining the desired circuit pattern. The entire board surface is then covered by comminuted conductive material, such as powdered copper or graphite, either as a dry powder or dispersed in a volatile liquid. The desired circuit pattern is then cured as by baking. During the curing, the comminuted conductive material becomes bonded to the film of deposited thermo-setting material which defines the circuit pattern while the film itself becomes adhesively bonded to the substrate. After curing, the comminuted conductive material not attached to the bonded film of photosensitive material, is removed leaving only the conductive material in the circuit pattern of photosensitive material. The circuit pattern is then plated by such methods as electroless plating, solder dipping, electroplating, and other suitable processes.

Figure 1:
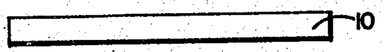

These and other objects of the invention will become apparent by the following description of the invention taken in connection with the accompanying drawings in which, FIG. 1 is a side of an insulative substrate.

FIGS. 2 to 9 are views similar to FIG. 1 depicting the substrate of FIG. 1 in various steps of processing during the production of a circuit pattern on a substrate in accordance with one embodiment of the invention.

Referring now to FIG. 1, the surface areas of substrate 10 are first cleaned by abrasive or detergent means, and then rinsed with water or other suitable liquids. The substrate may be comprised of glass, epoxy-glass, epoxy or other epoxy materials, anodized aluminum, and other similar insulative materials.

Figure 2:
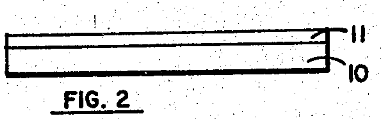

In the next step illustrated by FIG. 2, the substrate is coated with a solution or dispersion such as colloidal alumina, silica, or other materials which have the properties of adhering to the particular substrate material, and which leaves the surface hydrophilic. The substrate may be coated by dipping, spraying, or by other means known in the art. If the substrate is comprised of a material having the above properties, this step may be eliminated.

One example of a dispersion is the composition of 18 grams/liter of colloidal alumina, 5 ml./liter of hydrochloric acid, and 10 ml./liter of phosphoric acid. The remainder of the liter is distilled water.

For convenience in describing this embodiment of the invention, it is assumed that the substrate 10 comprises a sheet of epoxy impregnated glass fiber, that the dispersion 11 is the collodial alumina just described, and that the dispersion is applied to the surface of the substrate by dipping.

After the substrate has been dipped in the alumina dispersion, it is cured, for example, by baking in an oven at approximately 300° F. for approximately one hour to leave a cured dispersion layer 11. Curing time and temperature varies depending on the dispersion material, the substrate material, and other known factors as is well understood by those skilled in the art.

Figure 3:
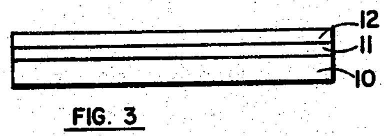

In the third step illustrated by FIG. 3, the substrate with the cured dispersion layer 11 is coated with a water soluble polyacrylic resin such as an acrylic copolymer (e.g. cyanomer A–370 of Amer. Cyanamid Co.) by immersing the substrate in a water-resin solution (34 g. resin per liter of water) for a period of time sufficient to permit the resin to adhere to the dispersion layer on the substrate. For the example given, the period of time is approximately two minutes. After the immersion, the substrate is rinsed by water to remove any excess. The rinsing leaves a thin hydrophilic film 12 on the cured dispersion layer. After rinsing, the substrate is dried.

The thin hydrophilic film 12 reinforces the hydrophilic dispersion layer 11 so that in subsequent steps other coatings do not penetrate to the substrate and become attached to the substrate at undesirable locations.

In lieu of the thin film 12, the second step may be repeated in order to achieve a hydrophilic dispersion layer 11 of desired thickness.

Other water soluble resinous materials such as water soluble melamine resins and water soluble polyvinyl alcohol acetate resins may be used in addition to the polyacrylic resin to provide a hydrophilic film 12.

Figure 4:
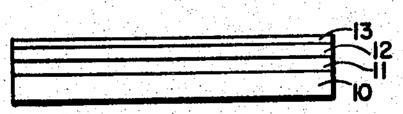

In step 4, illustrated by FIG. 4, the substrate is coated with a thin film 13 of a stabilized photosensitive compound comprised of elements such as P-diazo diphenyl amine sulphate in an amount preferably of 10 grams per liter, zinc chloride ($ZnCl_2$) in an amount preferably of 5 grams per liter, and distilled water to complete the liter. The preferred composition may be varied 25 percent without altering the properties of the compound.

The film 13 may be applied to the surface by various methods such as dipping or wiping on the solution lightly with a tissue applicator. Thereafter, the surface area is dried by some method such as by wiping the excess off with tissue wiper. The resulting photosensitive film 13 which coats the surface is a hydrophilic and photosensitive compound which can be exposed to actinic radiation and changed to a hydrophobic material.

Figure 5:
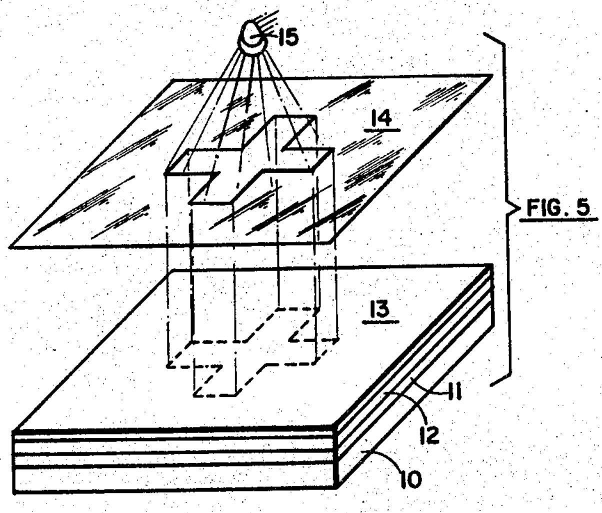

In step 5, illustrated by FIG. 5, a negative transparency 14, wherein the desired pattern is translucent, is interposed between the coated substrate and a source 15 of actinic radiation. For the embodiment shown, the radiation penetrates the film transparency and changes the hydrophilic material of the film 13 into a hydrophobic material in the desired circuit pattern.

Methods of producing actinic radiation sources and film transparencies defining a circuit pattern, and techniques for radiating surfaces, are all well known in the art. For the embodiment described herein, the coated substrate is exposed to ultraviolet radiation for approximately 5 minutes until the radiated portions of the film 13 completely change from hydrophilic to hydrophobic.

Figure 6:
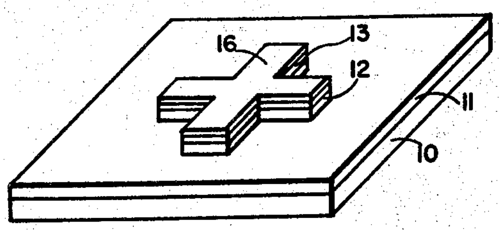

In step 6, illustrated by FIG. 6, the exposed substrate is developed by applying a thermo-setting material such as a resin based developer to the exposed surface, for example by rubbing the developer on with a sponge. The developing continues until the exposed surface is completely coated with the resin based composition of the developer. The hydrophobic characteristics of the exposure photosensitive material causes the developer to adhere to only the area defining the desired circuit pattern. The excess developer is then removed, for example by washing leaving behind a film 16 in only the desired pattern.

Films 12 and 13 around the exposed and developed pattern in the film 13 may be partially or totally removed by the developing and washing processes, depending on the adherance to the dispersion layer 11. The film 16 in the desired pattern coats the desired circuit area with a base material to which conductive materials to be applied in the next step can adhere.

The developer is comprised of a water based dispersion of a resin which can be reacted with a catalyst or a curing agent to yield an infusable, insoluble mass, such as one or more of the following thermo-setting resins; phenolics silicones, polysulfides, polyurethanes, polyamides, melamines, and polyesters.

In addition to being comprised of a thermo-setting resin, the developer is also comprised of a dispersing agent such as an emulsifier, a curing agent such as a melamine resin, a filler such as carbon black to give the developer strength, and an organic solvent such as toluene, methyl ethyl ketone for dissolving the resin.

A specific and preferred developer of epoxy thermo-setting resin including a curing agent, filler and solvent is comprised as follows:

| | |
|---|---|
| 1st solid epoxy, commercially available as Epon 1004, 875–1025 epoxide equivalent 4.6–6.6 poises viscosity ______ g__ | 286 |
| 2nd solid epoxy, commercially available as Epon 1007, 200–2500 epoxide equivalent 18–28 poises viscosity ______ g__ | 286 |
| Cyclohexanone ______ l | 1.10 |
| Mixture of mono, di and tri propylene glycol methyl ether ______ l__ | 0.70 |
| Xylene solvent ______ l__ | 1.40 |
| Carbon black ______ g__ | 168 |
| Polyoxypropylene, commercially available as Pluronic F–68 ______ g__ | 100 |
| Deionized water ______ l__ | .95 |
| Zirconium acetate-water 22% solution ______ l__ | 0.114 |
| 35% colloidal dispersion of silica, commercially available as Nalcoag 1035 ______ l__ | 2.27 |
| Melamine resin, commercially available as Beetle 227–8 ______ l__ | 0.57 |

Figure 7:
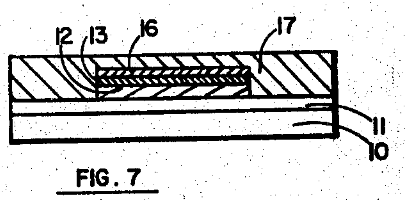

In the next step illustrated in FIG. 7, the substrate with the formed circuit pattern 16 is coated with conductive material 17 such as comminuted copper, graphite or other conducting materials either in dispersion or powdered form. One example of a conducting material which may be used is 100 grams per liter of comminuted copper mixed with water and colloidal alumina.

Figure 8:
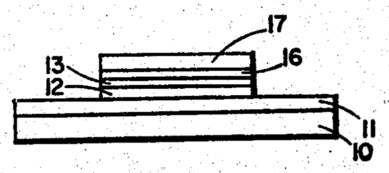

In the next step, the conducting material 17 is fused to the circuit defining base layer 16 by subjecting the coated substrate to heat, for example to 160° F. for approximately 15 minutes and then subjecting the coated substrate to heat for an additional two hours at 300° F. for the exemplary embodiment described herein. After heating the substrate to bond the conductive material to the circuit area, the excessive conductive material not attached to the desired circuit area is washed away leaving a conducting layer in a desired circuit pattern as shown in FIG. 8.

Figure 9:
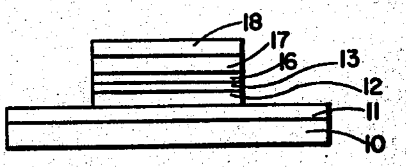

In the last step illustrated in FIG. 9, the substrate is plated with a conductive material 18 such as nickel, preferably by electroless deposition in a manner which is well known in the art and therefore not discussed herein except to note that one step of the electroless deposition process may require coating the surface area of the substrate to be plated with a catalyst such as a palladium chloride solution.

In the event anodized aluminum is used as an insulative substrate, an additional step must be taken. Anodized aluminum is slightly attached by certain electroless plating solutions such as an electroless nickel plating solution and must be protected while electroless plating by covering the non-circuit areas with a resist material applied by well known processes such as the silk screen process.

Although the invention has been described and illustrated in detail, it is to be clearly understood that the same is by way of illustration and example and is not to be taken by way of limitation, the spirit and scope of this invention being limited only by the terms of the appended claims.

I claim:

1. A process for application of a conductive electrical circuit on a non-conductive epoxy impregnated glass substrate comprising:

- coating a surface of said substrate with a first film of hydrophilic material, said film comprising colloidal alumina;
- applying atop said first film a layer containing a hydrophilic and photosensitive compound;
- exposing said layer to ultraviolet light through a negative transparency having the desired circuit pattern, thereby transforming the regions of said layer struck by light into hydrophobic material to form a latent image;
- developing said latent image with a developer containing a thermosetting resin, said resin adhering only to said hydrophobic material and said developer also dissolving and thereby removing the unexposed regions of said layer;
- coating entire surface of said substrate with comminuted particles of conductive material;
- heating said substrate to fuse said comminuted particles to said thermosetting resin; and removing comminuted particles from regions of said substrate not covered by said thermosetting resin.

2. The process defined in claim 1 wherein said compound comprises from 8.75 to 11.25 grams per liter of P-diazo diphenyl amine sulphate, 4.4 to 5.6 grams per liter of $ZnCl_2$, and sufficient distilled water to complete the liter.

3. The process defined in claim 2 wherein said developer comprises a thermo-setting resin, a dispersing agent, a curing agent, a filler, and an organic solvent.

4. The process defined in claim 3 wherein said comminuted particles comprise comminuted copper mixed with water and colloidal alumina.

5. The process defined in claim 4 wherein said thermosetting resin comprises a mixture of a first epoxy having 875 to 1025 epoxide equivalent and a second epoxy having 2000 to 25000 epoxide equivalent, wherein said dispersing agent comprises polyoxypropylene, wherein said curing agent comprises melamine resin, wherein said filler comprises carbon black, and wherein said solvent comprises xylene.

6. The process defined in claim 2 wherein said developer comprises the following:

| | |
|---|---|
| First solid epoxy having 875–1025 epoxide equivalent and 4.6–6.6 poises viscosity ----------g-- | 286 |
| Second solid epoxy having 2000–2500 epoxide equivalent and 18–28 poises viscosity ------g-- | 286 |
| Cyclohexanone ----------------------------l-- | 1.10 |
| Mixture of mono, di and tri propylene glycol methyl ether ----------------------------l-- | 0.70 |
| Xylene solvent ----------------------------l-- | 1.40 |
| Carbon black ----------------------------g-- | 168 |
| Polyoxypropylene ----------------------------g-- | 100 |
| Deionized water ----------------------------l-- | .95 |
| 22% solution of zirconium acetate-water -----l-- | 0.114 |
| 35% colloidal dispersion of silica ------------l-- | 2.27 |
| Melamine resin ----------------------------l-- | 0.57 |

7. The process defined in claim 5 comprising the additional steps of:

heating said first film of colloidal alumina to approximately 300° F. for approximately one hour to cure said film, and covering said cured film with a coating of water soluble polyacrylic resin prior to applying said layer.

8. The process defined in claim 7 comprising the additional final step of:

plating areas having said thermosetting resin and said fused comminuted particles with conductive material.

References Cited

UNITED STATES PATENTS

| | | | |
|---|---|---|---|
| 3,222,173 | 12/1965 | Belko et al. ------ | 96—36.2 XR |
| 3,320,657 | 5/1967 | Strobel. | |
| 2,585,700 | 2/1952 | Strickman --------- | 96—36.2 X |
| 2,600,343 | 6/1952 | Tuttle ------------- | 96—36.2 X |
| 2,714,066 | 7/1955 | Jewett et al. --------- | 96—33 X |
| 2,754,279 | 7/1956 | Hall ---------------- | 96—49 X |
| 2,914,404 | 11/1959 | Fanselau et al. ------- | 96—36.2 |
| 2,937,085 | 5/1960 | Seven et al. ------------ | 96—33 |
| 2,996,381 | 8/1961 | Oster et al. -------- | 96—115 X |
| 3,006,819 | 10/1961 | Wilson et al. -------- | 96—38.4 |
| 3,135,823 | 6/1964 | Pritikin ----------- | 96—36.2 X |
| 3,189,451 | 6/1965 | Reichel ------------- | 96—49 |

OTHER REFERENCES

Brace, Irving A., "The Graphic Arts Monthly," May 1956 (pp. 26, 28 and 30 relied on).

NORMAN G. TORCHIN, *Primary Examiner.*

C. L. BOWERS, *Assistant Examiner.*